Figure 1:
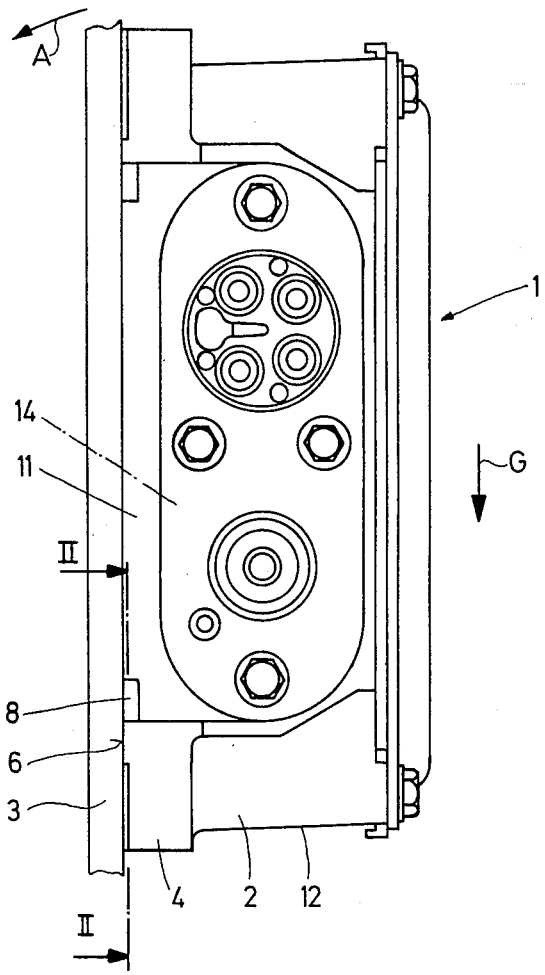

United States Patent [19]

Jakob et al.

[11] 3,973,477
[45] Aug. 10, 1976

[54] WATER SPRAY-RESISTANT, VENTILATED HOUSING STRUCTURE

[75] Inventors: Gert Jakob, Stuttgart; Willi Gansert, Kornwestheim, both of Germany

[73] Assignee: Robert Bosch G.m.b.H., Stuttgart, Germany

[22] Filed: June 13, 1975

[21] Appl. No.: 586,583

[30] Foreign Application Priority Data
Aug. 17, 1974 Germany............................ 2439524

[52] U.S. Cl............................... 98/1; 174/17 VA; 200/306; 220/374
[51] Int. Cl.² ......................................... H01H 9/04
[58] Field of Search............... 98/1; 174/16 R, 17 R, 174/17 VA; 200/300; 220/374 X

[56] References Cited
UNITED STATES PATENTS
1,385,995   8/1921   Hellmund .................................. 98/1

*Primary Examiner*—William E. Wayner
*Attorney, Agent, or Firm*—Flynn and Frishauf, P.C.

[57] ABSTRACT

To protect electronic components located within a housing structure, or casing, which contains ventilation openings, against corrosion due to intrusion of water, for example being sprayed thereon upon cleaning of the area on which the structure is mounted, the housing is formed with an attachment surface having ventilation ducts formed therein which are generally Y-shaped having two branch ducts terminating at the outside of the housing in spaced position, and forming an angle with respect to each other, for example terminating at essentially right angled housing edges, and a third trunk duct connected to the interior of the housing, and branching off from the two branch ducts, so that water sprayed against the housing may run through the branch ducts, without impingement on a back wall, and ventilation is provided by additional movement of air through the trunk of the Y-shaped duct; the ducts are preferably mounted with respect to the housing in such a manner that any liquid which might accumulate within the housing structure, due to condensation, can drain off, that is, can flow out through one of the branch ducts by gravity.

14 Claims, 2 Drawing Figures

WATER SPRAY-RESISTANT, VENTILATED HOUSING STRUCTURE

The present invention relates to a housing structure which is so constructed that it contains ventilating openings, and yet is resistant to intrusion by water, or other liquids which may be sprayed against the housing structure, or in the immediate vicinity, and more particularly to a housing structure for electronic apparatus, especially for electronic apparatus to be used in automotive vehicles.

Electronic apparatus used in automotive vehicles is frequently mounted in the engine compartment; the apparatus is thus subjected to the rough environmental conditions of the motor vehicle itself. Frequently it is located at a position where it is accessible for testing or servicing, thus at a position which is not well protected. The electronic components within the housing may include various electronic elements such as semiconductors, capacitors, resistors, integrated circuits, and other electronic elements which are mounted on organic or inorganic carrier substrates, such as XXXP circuit boards, epoxy-glass fiber substrates or carriers, ceramic substrates, or the like. It is important that water and high atmospheric humidity be excluded from the interior of the housing, in order to prevent corrosion and to retain the high insulation resistances of the electronic elements as well as of the carrier plates themselves. Hermetically sealing the housing is one solution which, however, is expensive, leads to cooling difficulties, and is, in general, commercially not suitable.

Ventilating the housing prevents establishment within the housing of peculiar climatic conditions within the housing itself. It has previously been proposed to include electronic apparatus in housings which are formed with ventilating ducts so constructed that they form a tortuous, or labyrinth path from the outside into the housing. Spray water used to clean surrounding areas may, however, penetrate into such apparatus through the ventilating path, even if the duct itself has various turns or changes of directions, particularly if a stream of water directly impinges on the ventilating duct. It is particularly difficult to prevent penetration of water into the housing if pressure of a water spray or stream directed against the housing or surrounding area is high, or if the spray time is comparatively long. This condition may obtain, for example, when pressure-cleaning the engine compartment of a motor vehicle.

It is an object of the present invention to provide a housing structure for electronic apparatus, and an electronic apparatus, in general, which is so constructed that water will not penetrate thereinto even if a stream of water is directed against the ventilating opening itself.

SUBJECT MATTER OF THE PRESENT INVENTION

Briefly, the ventilating duct is so constructed that, in the projection of the back side of the housing, it is essentially Y-shaped, with the two branches of the Y terminating at the edges of the housing to form a through-duct; the trunk of the Y is connected to the interior of the housing, that is, to an internal ventilating duct; the two branches of the Y terminate at different sides of the housing.

The structure of the present invention, therefore, provides a through-duct for water which is directed against the ventilating opening of the housing, to prevent reflection, or ricochet effects of streams of water directed against any one of the ventilating openings, the trunk of the Y branching off at the direction which is preferably so located that any water penetrating therein will, automatically, drain off.

In accordance with a feature of the invention, the branch ducts terminating at the edges of the housing have approximately the same size, or diameter, or diametrical area. The housing is so located on the branch ducts that they terminate at the lowest point of the housing, to provide for drainage of water by gravity. Additionally, and in accordance with a preferred feature, the trunk duct leading to the interior of the housing is formed with a constriction, that is, tapers, in funnel form, to a constricted point and then extends to an opening which is perpendicular to the direction of the trunk duct, the trunk duct enlarging, again, to enhance the funnel effect. The opening leading into the interior of the housing, preferably, is curved, for example formed as a circular segment.

Figure 2:
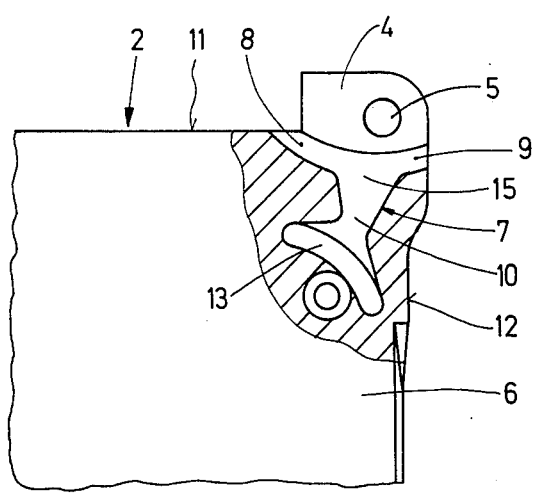

The invention will be described by way of example with reference to the accompanying drawings, wherein:

FIG. 1 is a highly schematic view of an electronic apparatus, adapted for vertical mounting in a motor vehicle, and illustrating concepts of the present invention; and FIG. 2 is a fragmentary view, partly in section, taken along line II—II of FIG. 1.

The electronic apparatus 1, for example an electronic ignition system, an electronic fuel injection control system, or other electronic control apparatus for a motor vehicle is included within a housing 2 which is secured at an attachment 3 in the engine compartment of a motor vehicle. The alignment of the apparatus is vertical, or essentially vertical, as shown in FIG. 1, in which the direction of the force of gravity is schematically indicated by the arrow G. It is not necessary that the apparatus be mounted exactly vertically, so long as the vertical vector of the mounting is sufficient to provide for drainage by gravity (as will appear below). Housing 2 is made as a plastic injection molding, formed with attachment eyes 4, having attachment holes 5 therein. A ventilating duct 7 is formed at the attachment side 6 of the housing. In accordance with the present invention, this ventilating duct 7 is essentially Y-shaped (see FIG. 2) having two branch sections 8, 9 and a trunk section 10. The branch 8 terminates at the longitudinal side 11 of the housing 2. The branch 9 terminates at the cross side 12 of the housing 2. Both branches 8, 9 have approximately the same diameter, or approximately the same cross-sectional area. The trunk section 10 extends interiorly into the housing to an opening 13, which terminates in the interior 14 of the housing 2. The interior 14 of the housing 2 retains carrier plates for electronic elements, in suitable mountings, not shown, and standard in the art.

The trunk 10 is so shaped that it constricts, in funnel shape, behind the branch-off zone 15 to a constricted zone, and then again increases, funnel-shaped, to terminate in the opening 13. Opening 13 is formed as a circular segment, the outer surface of which merges in the trunk 10. This construction permits mounting of the housing 2 at inclinations departing from strict vertical alignment of the side 11 while still providing for drainage, by gravity, of any liquid in the segment 13. If, for example due to ambient climatic conditions, condensation droplets should form within the interior 14 of the housing 2, moisture will run to the lowest point of the interior 14, to be drained off directly from the segment 13 into the funnel-shaped collection area of trunk 10, to be then led to the branches 8, 9 at the lowest point. Thus, the housing can be tipped both along the arrow A (FIG. 1) as well as in and out of the plane of the paper and still provide for drainage of liquid from the interior of the housing. It is to be noted that FIG. 2 is drawn upside-down, with respect to FIG. 1, for ease of illustration. Damage due to corrosion, or decrease of insulation effectiveness of the insulating mounting plate is, thereby, effectively prevented.

Automotive engines are sometimes cleaned by pressure sprays; if, upon washing of the engine, or of the engine compartment, water is sprayed at the cross side 12 of the housing 2, so that water will penetrate into the branch 9, then the greater portion of the water, penetrating up to the junction 15 of the trunk section 10, can flow out again through the branch 8. Any water sprayed into the duct 10 is thus not retained under pressure, but rather is vented by the opening formed by the other branch 8, and introduction of spray under pressure into the housing is prevented. Any water which should penetrate into the trunk section 10 will be under so little pressure that it cannot rise to the opening 13. The constriction, and the funnel-shaped narrowing of the trunk 10, additionally prevent ingress of water to the opening 13.

The relationships are reversed if water is sprayed onto the longitudinal side 11 of the housing 2. Water can flow, by gravity, out through branch 9. The pressure drop of water being sprayed against the ventilating duct 7 is, again, so high that the remaining pressure with which the water is sprayed against the housing is insufficient to press the water upwardly into the interior 14. Again, the funnel-shaped constriction of the trunk 10, and the angling-off of the trunk 10, contribute to keeping any water out of the interior of the housing.

Various changes and modifications may be made within the scope of the inventive concept; the specific arrangement of the branches 8, 9, as shown in FIG. 2, has been found desirable; other arrangements may, however, be used.

We claim:
1. Water spray-resistant, ventilated housing structure arranged to prevent entry, or accumulation of moisture within the housing structure, comprising
 a housing (2) formed with an attachment surface (6) to a support, and a ventilating duct (7) formed in the surface and extending into the housing interior (14), said ventilating duct extending at an angle with respect to the attachment surface (6) of the housing,
 wherein the ventilating duct is generally Y-shaped having two branch ducts (8, 9) of at least approximately equal cross sectional areas, terminating at the outside of the housing in spaced positions and forming an angle with the outside of the housing at the point of termination of said branch ducts, and a third trunk duct (10) connected to the interior (14) of the housing and branching off the branch ducts inside the housing, the trunk duct leading off the branch ducts at an angle with respect to each of the branch ducts.

2. Structure according to claim 1, wherein the housing is essentially rectangular, and the branch ducts (8, 9) terminate at different outer sides (11, 12) of the housing (2).

3. Structure according to claim 1, wherein the housing (2) is mounted on the support with an orientation such that the branch ducts (8, 9) terminate at the lowest points of the outer sides (11, 12) of the housing (2).

4. Structure according to claim 1, wherein the trunk duct (10) branching off the branch ducts (8, 9) tapers inwardly, funnel-shaped, to a constriction and then again expands to terminate in an opening (13) leading into the interior (14) of the housing.

5. Structure according to claim 4, wherein the inner, expanded portion (13) of the branch duct is curved to permit drainage of moisture from the interior (14) of the housing into the trunk duct (10) even if the housing is mounted in a position other than one in which the trunk duct extends in a predetermined design direction.

6. Structure according to claim 5, wherein the curved section (13) of the inner opening of the trunk duct (10) is shaped approximately in the form of a circular segment, so that the interior (14) of the housing (2) within a predetermined angular range will have the lowest point thereof connected to the trunk duct (10).

7. Moisture-resistant, ventilated electronic housing structure, for incorporation on a support surface forming part of a vehicle, wherein said housing structure is essentially of rectangular outline
 and comprises the structure of claim 1.

8. Water spray-resistant, ventilated housing structure in combination with a support arranged to prevent entry, or accumulation of moisture within the housing structure, comprising
 a housing (2) formed with an attachment surface (6) to the support, and a ventilating duct (7) formed in the surface and extending into the housing interior (14), said ventilating duct extending at an angle with respect to the attachment surface (6) of the housing,
 wherein the ventilating duct is generally Y-shaped having two branch ducts (8, 9) terminating at the outside of the housing in spaced positions and forming an angle with the outside of the housing at the point of termination of said branch ducts, and a third trunk duct (10) connected to the interior (14) of the housing and branching off the branch ducts inside the housing, the trunk duct leading off the branch ducts at an angle with respect to each of the branch ducts; and wherein
 the housing (2) is mounted on the support with an orientation such that the branch ducts (8, 9) terminate at the lowest points of the outer sides (11, 12) of the housing (2).

9. Structure according to claim 8, wherein the cross-sectional areas of the branch ducts (8, 9) are at least approximately equal.

10. Structure according to claim 8, wherein the trunk duct (10) branching off the branch ducts (8, 9) tapers inwardly, funnel-shaped, to a constriction and then again expands to terminate in an opening (13) leading into the interior (14) of the housing.

11. Structure according to claim 10, wherein the inner, expanded portion (13) of the branch duct is curved to permit drainage of moisture from the interior (14) of the housing into the trunk duct (10) even if the housing is mounted in a position other than one in which the trunk duct extends in a predetermined design direction.

12. Structure according to claim 11, wherein the curved section (13) of the inner opening of the trunk duct (10) is shaped approximately in the form of a circular segment, so that the interior (14) of the housing (2) within a predetermined angular range will have the lowest point thereof connected to the trunk duct (10).

13. Water spray-resistant, ventilated housing structure arranged to prevent entry, or accumulation of moisture within the housing structure for incorporation on a support surface forming part of a vehicle, comprising a housing (2) formed with an attachment surface (6) to a support, and a ventilating duct (7) formed in the surface and extending into the housing interior (14), said ventilating duct extending at an angle with respect to the attachment surface (6) of the housing, wherein the ventilating duct is generally Y-shaped having two branch ducts (8, 9) terminating at the outside of the housing in spaced positions and forming an angle with the outside of the housing at the point of termination of said branch ducts, and a third trunk duct (10) connected to the interior (14) of the housing and branching off the branch ducts inside the housing, the trunk duct leading off the branch ducts at an angle with respect to each of the branch ducts; and wherein said housing structure is essentially of rectangular outline.

14. Structure according to claim 13, wherein the cross-sectional areas of the branch ducts (8, 9) are at least approximately equal.

* * * * *